US010422920B2

(12) United States Patent
Ellis et al.

(10) Patent No.: US 10,422,920 B2
(45) Date of Patent: Sep. 24, 2019

(54) FORMATION CHARACTERIZATION FOR FAST FORWARD NEUTRON MODELS

(75) Inventors: Darwin V. Ellis, Ridgefield, CT (US); Charles Case, West Redding, CT (US); Joseph M. Chiaramonte, Sherman, CT (US)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 181 days.

(21) Appl. No.: 14/119,181

(22) PCT Filed: May 23, 2012

(86) PCT No.: PCT/US2012/039167
§ 371 (c)(1),
(2), (4) Date: Nov. 20, 2013

(87) PCT Pub. No.: WO2012/162404
PCT Pub. Date: Nov. 29, 2012

(65) Prior Publication Data
US 2014/0088877 A1     Mar. 27, 2014

Related U.S. Application Data

(60) Provisional application No. 61/488,948, filed on May 23, 2011, provisional application No. 61/512,191, filed on Jul. 27, 2011.

(51) Int. Cl.
*G01V 5/10* (2006.01)
*G06F 17/50* (2006.01)

(52) U.S. Cl.
CPC ............. *G01V 5/10* (2013.01); *G01V 5/107* (2013.01); *G06F 17/5009* (2013.01)

(58) Field of Classification Search
CPC .......... G01V 5/10; G01V 5/00; G01V 5/0025; G01V 5/04; G01V 5/08; G01V 5/085; G01V 5/107; G06F 17/50; G06F 17/5009
See application file for complete search history.

(56) References Cited

U.S. PATENT DOCUMENTS 4,570,067 A * 2/1986 Gadeken ................ G01V 5/108
250/266
4,816,674 A * 3/1989 Ellis ....................... G01V 5/107
250/266

(Continued)

FOREIGN PATENT DOCUMENTS

CN     1270270 A     10/2000
CN     1619100 A      5/2005

(Continued)

OTHER PUBLICATIONS

M. P. Smith, Neutron Absorption Effects on Dual-Spaced Thermal Neutron Logging Tools, Jun. 29-Jul. 2, 1987, SPWLA Twenty-Eight Annual Logging Symposium, 18 pp.*

(Continued)

*Primary Examiner* — Toan M Le
(74) *Attorney, Agent, or Firm* — Sara K. M. Hinkley

(57) ABSTRACT

A method for simulating a response of a neutron well logging instrument includes in a computer, defining a function of neutron migration length with respect to expected radiation detector counting rate. The function is defined for selected values of formation porosity. The function is related to neutron slowing down length and neutron diffusion length. The function is weighted for formation density. An expected radiation detector counting rate is calculated in the computer using the defined function based on an initial estimation of formation porosity and density.

20 Claims, 7 Drawing Sheets

(56) References Cited

U.S. PATENT DOCUMENTS

| | | | |
|---|---|---|---|
| 5,293,410 | A | 3/1994 | Chen et al. |
| 5,334,833 | A | 8/1994 | Case et al. |
| 5,377,105 | A * | 12/1994 | Smith .................... G01V 5/107 |
| | | | 702/12 |
| 5,699,246 | A | 12/1997 | Plasek et al. |
| 7,408,150 | B1 | 8/2008 | Flaum et al. |
| 9,568,639 | B2 | 2/2017 | Grau et al. |
| 9,575,208 | B2 | 2/2017 | Grau et al. |
| 2004/0104821 | A1 | 6/2004 | Clark |
| 2009/0045328 | A1 | 2/2009 | Fricke et al. |
| 2010/0004867 | A1 | 1/2010 | Zhou et al. |
| 2011/0191030 | A1 | 8/2011 | Roberts |
| 2016/0349398 | A1 | 12/2016 | Zhou et al. |

FOREIGN PATENT DOCUMENTS

| | | |
|---|---|---|
| GB | 2298918 B | 1/1999 |
| WO | 2009/026061 | 2/2009 |

OTHER PUBLICATIONS

Dunn et al., Gas/Steam Saturation Effect on Pulsed Neutron Capture Count Rates, Mar.-Apr. 1994, The Log Analyst, pp. 52-64.*

Office Action issued in related CN Application No. 201280036556.5 dated Dec. 23, 2015, with English translation by Agent (17 pages).

A. Mendoza, Linear iterative refinement method for the rapid simulation of borehole nuclear measurements, Part I: Vertical wells,: Geophysics, 75, No. 1, pp. E9-E29.

A. Mendoza, et al., "Linear iterative refinement method for the rapid simulation of borehole nuclear measurements: Part 2—High-angle and horizontal wells," Geophysics, Society of Exploration Geophysicists, US, vol. 75, No. 2, Mar. 1, 2010, pp. E79-E90.

A. Mendoza, et al, "Rapid Simulation of Borehole Nuclear Measurements with Approximate Spatial Flux-Scattering Functions," SPWLA 48th Annual Logging Symposium, Jun. 3-6, 2007.

D.V. Ellis, et al, "The Effect of Formation Absorption on the Thermal Neutron Porosity Measurement," Paper 16814-MS, 62nd SPE Annual Technical Conference and Exhibition, Dallas, Texas 1987.

D. Dworak, et al, "Numerical modeling of the gamma-gamma density tool responses in horizontal wells with an axial asymmetry," Applied Radiation and Isotopes, Elsevier, vol. 69, No. 1, Jan. 1, 2011, pp. 268-274.

C.C. Watson, "Monte Carlo Computation of Differential Sensitivity Functions," Trans. Am Nucl. Soc., vol. 46, p. 655, 1984.

C.C. Watson, "A Spatial Sensitivity Analysis Technique for Neutron and Gamma-Ray Measurements," Trans. Am Nucl. Soc., vol. 65 (Suppl. 1), pp. 3-4, 1992.

Office Action issued in related CN Application No. 201280036556.5 dated Aug. 16, 2016, with English translation by Agent (22 pages).

Office Action issued in Mexican Patent application MX/a/2013/013612 dated Feb. 3, 2015. No translation available. 3 pages.

Office Action issued in U.S. Appl. No. 14/960,429 dated Oct. 6, 2016. 16 pages.

Final Office Action issued in U.S. Appl. No. 14/960,429 dated Apr. 21, 2016. 21 pages.

International Search Report and Written Opinion issued in International Patent application PCT/US2012/039167 dated Dec. 6, 2012. 13 pages.

International Preliminary Report on Patentability issued in International Patent application PCT/US2012/039167 dated Nov. 26, 2013. 7 pages.

Zhou et al., "A Second-Order Fast-Forward Model for a Gamma-Gamma Density Logging Tool," SPE 124193, SPE Annual Technical Conference and Exhibition, New Orleans, LA, USA, 2009.

* cited by examiner

FORMATION CHARACTERIZATION FOR FAST FORWARD NEUTRON MODELS

BACKGROUND

This disclosure relates to systems and methods for neutron measurement analysis of subterranean formations. More particularly, the disclosure relates to fast forward neutron models for the interpretation of measurements made in subterranean wells.

In neutron well logging, Monte Carlo methods are preferred for simulation of neutron well logging instrument response because of their accuracy. However, Monte Carlo methods have not been suitable for real-time neutron well logging instrument analysis due to the limited computational speed of present computers.

An example of a linear-based, Monte Carlo forward modeling technique for nuclear well logging instruments is described in Charles C. Watson, *Monte Carlo Computation of Differential Sensitivity Functions*, Trans. Am. Nucl. Soc., vol. 46, page 655, 1984, and Charles C. Watson, *A Spatial Sensitivity Analysis Technique for Neutron and Gamma-Ray Measurements*, Trans. Am. Nucl. Soc., vol. 65 (Suppl.1), pp.3-4, 1992, hereinafter referred to as "the Watson Papers." By linearly modeling the dominant gamma-ray interactions of Compton scattering and photoelectric absorption, the technique described in the Watson papers may be used to predict the detector response of a Compton-scatter gamma ray density well logging instrument. The primary advantage of the foregoing method as applied to density instruments is its very fast computational speed, in that it can provide calculated results on a sub-second scale. The basic premise of the model assumes a linear relationship between the instrument's detector response and changes in the formation density and photoelectric properties of the formation being examined. Space around the instrument disposed in a wellbore is divided into a grid of cells, each of which is assigned a sensitivity. The contribution of each cell to the overall instrument response estimate may be obtained from pre-calculated spatial sensitivity maps. Further details of the density sensitivity function technique are disclosed in U.S. Pat. No. 5,334,833 issued to Case et al. The performance of the foregoing linear technique may include relative accuracies of a few percent in count space which must then be converted to density space. For example, when applying the linear modeling method to a logging while drilling ("LWD") formation density measuring instrument, e.g., one operated under the trademark VISION 475, which is a mark of Schlumberger Technology Corporation, Sugar Land, Tex., USA, modeling error in comparison to experimental data was found to be as much as 0.1 g/cc within 1" water standoff when covering typical spatial variations in density from 1 to 3 g/cc. The limited performance of the linear method is also apparent in that the density sensitivity functions are not identical when calculated using different reference formations.

Some improvement in accuracy of the foregoing method can be obtained by modifying the sensitivity functions on a case-by-case basis, but such adjustments are not fully general. A. Mendoza, C. Tomes-Verdin, and W. Preeg, *Rapid Simulation of Borehole Nuclear Measurements With Approximate Spatial flux-Scattering Functions*, (SPWLA 48th Annual Logging Symposium, Jun. 3-6, 2007) discloses a spatial flux-scattering functions (FSF) technique to rapidly simulate neutron porosity and gamma-gamma (Compton scattering) density well logs.

The development of the FSF technique (See also Mendoza, A., C. Torres-Verdin, and W. E. Preeg, 2010, *Linear iterative refinement method for the rapid simulation of borehole nuclear measurements, Part I:Vertical wells:* Geophysics, 75, no. 1. E9-E29) suggested that the technique could be applied to the generation of a fast forward neutron porosity model. Initial tests with a generic nuclear well logging tool model using AmBe chemical isotope source neutrons looked promising. However, upon scrutiny, the results provided by a FSF-based fast model for a neutron logging tool with a pulsed neutron source (which generates 14 MeV neutrons) proved inadequate in simulating results for invasion of gas-saturated formations and for handling the effects of variation of formation water salinity.

What is needed is an improved technique for fast forward modeling of neutron well logging instrument response.

SUMMARY

One aspect of the disclosure is a method for simulating a response of a neutron well logging instrument. The method includes, in a computer, defining a function of neutron migration length with respect to expected radiation detector counting rate. The function is defined for selected values of formation porosity. The function is related to neutron slowing down length and neutron diffusion length. The function is weighted for formation density. An expected radiation detector counting rate is calculated in the computer using the defined function based on an initial estimation of formation porosity and density.

Other aspects and advantages of the invention will be apparent from the description and claims which follow.

DETAILED DESCRIPTION

Figure 1:
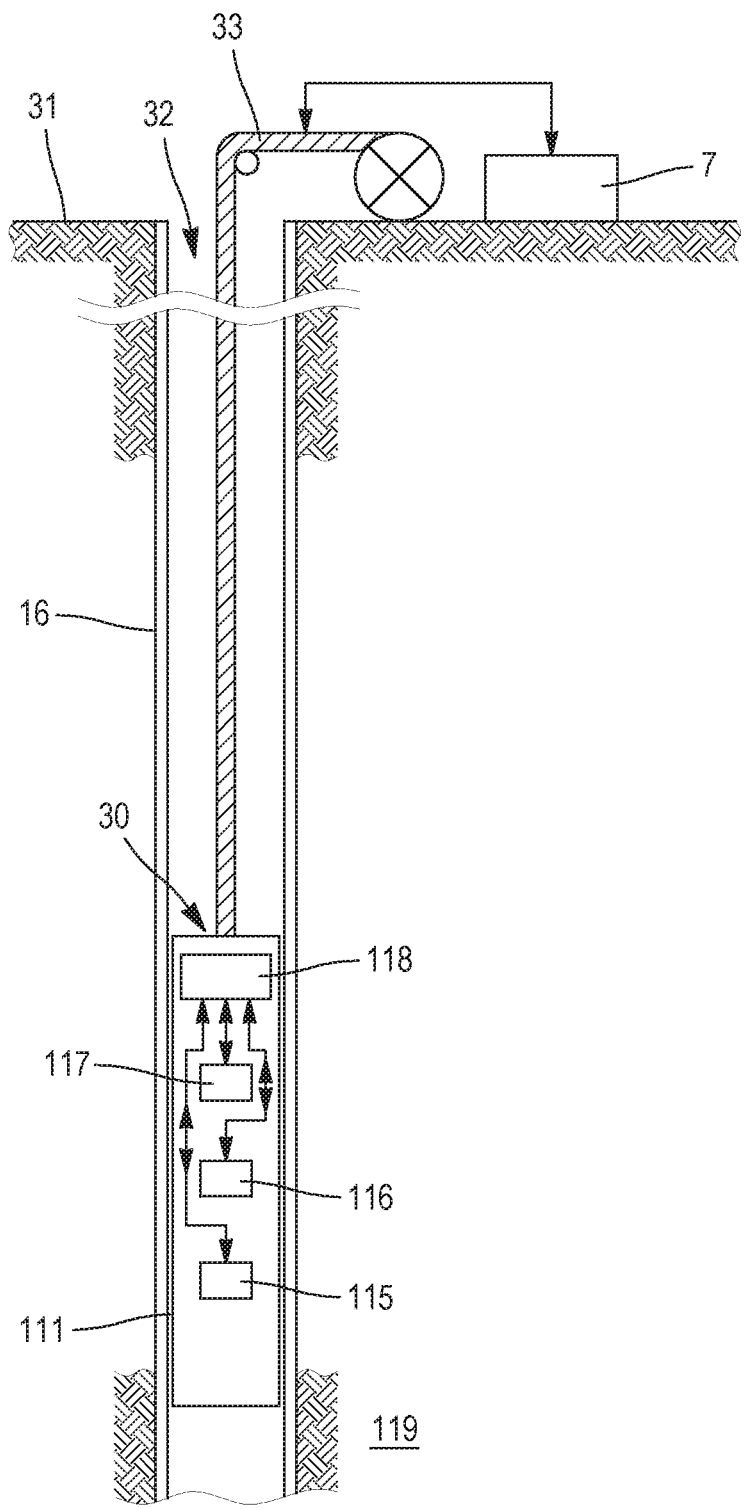
FIG. 1 shows an example nuclear well logging instrument disposed in a wellbore drilled through subsurface formations.

Error! Reference source not found. shows an example "neutron porosity" well logging instrument 30. The measurement components of the instrument 30 may be disposed in a housing 111 shaped and sealed to be moved along the interior of a wellbore. The pulsed neutron well logging instrument 30 may, in a form hereof, be of a type described, for example, in U.S. Pat. No. 5,699,246.

The well logging instrument 30 may contain a chemical or pulsed neutron source 115, and two or more neutron detectors 116, 117 at different axial spacings from the neutron source. The neutron source 115 (hereinafter "source"), when activated, will emit controlled duration "bursts" of high energy neutrons (approximately 14 MeV, and which may be emitted isotropically). One example of a neutron source is described in U.S. Pat. No. 5,293,410 issued to Chen et al. and incorporated herein by reference.

The neutron detectors 116, 117 may detect neutrons arriving at the detector as a function of time. Such measurements may be used to provide hydrogen index (HI) measurement of the formations 119 surrounding the instrument. In some examples, the detectors 116, 117 may be $^3$He proportional counters. In other examples, the source 115 may be a chemical isotope source such as americium 241 in a beryllium "blanket."

The well logging instrument 30 maybe coupled to an armored electrical cable 33 that may be extended into and retracted from the wellbore 32. The wellbore 32 may or may not include metal pipe or casing 16 therein. The cable 33 conducts electrical power to operate the instrument 30 from a surface 31 deployed recording system 7, and signals from the detectors 116, 117 may be processed by suitable circuitry 118 for transmission along the cable 33 to the recording system 7. The recording system 7 may include a computer as will be explained with reference to FIG. 2 as well as devices for recording with respect to depth and/or time the signals communicated along the cable 33 from the instrument 30. Those skilled in the art will recognize that the instrument shown in FIG. 1 may also be configured to be conveyed by a drill string used to drill the wellbore 32, and thus form part of a logging while drilling ("LWD") instrument. Such LWD instruments may include devices therein for recording signals detected by the various sensors and detectors in the instrument, and may include a communication subsystem for transmitting some or all of such signals to the recording unit 7 at the surface, for example, by modulating pressure of drilling fluid pumped into the drill string. The cable conveyance shown in FIG. 1 is therefore not to be construed as a limit on the scope of the present disclosure.

Figure 2:
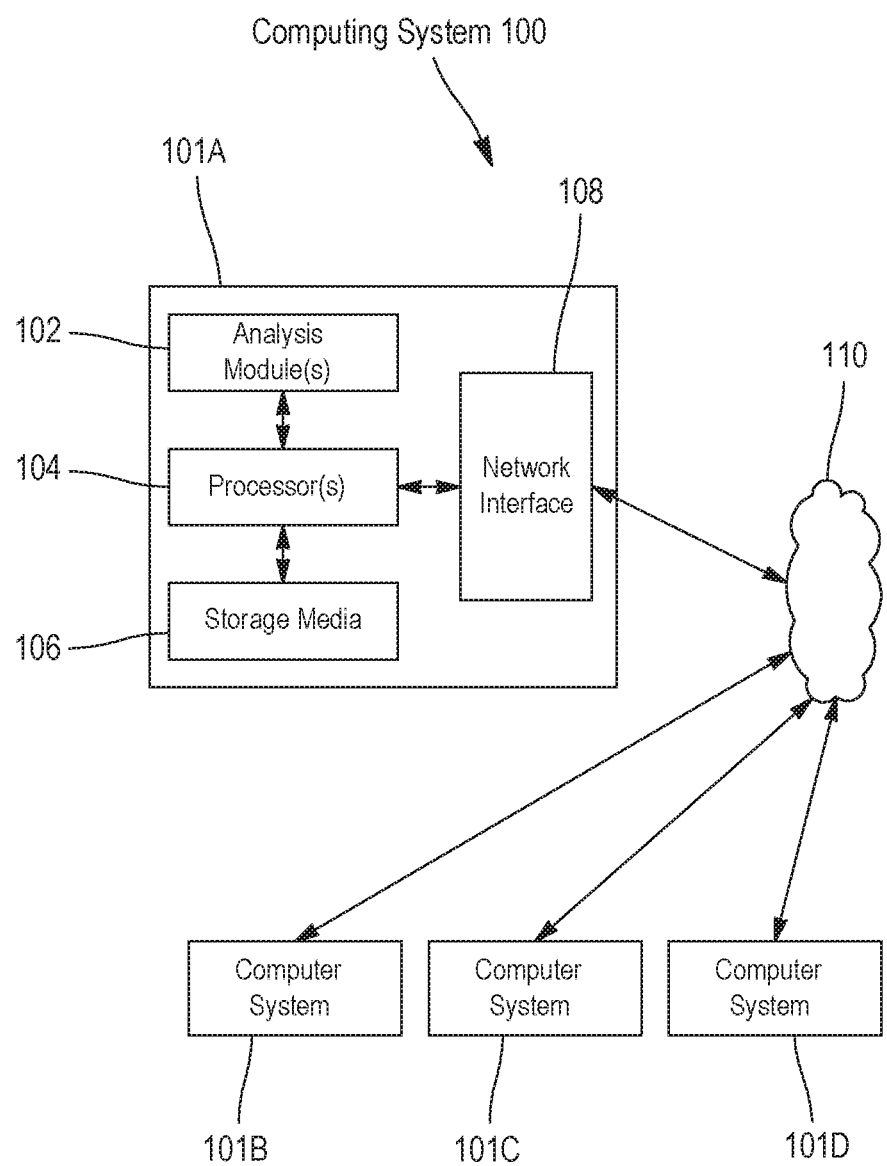
FIG. 2 depicts an example computing system.

FIG. 2 depicts an example computing system 100 in accordance with some embodiments. The computing system 100 can be an individual computer system 101A or an arrangement of distributed computer systems. The computer system 101A includes one or more analysis modules 102 that are configured to perform various tasks according to some embodiments, such as the tasks whose results are depicted in FIGS. 3 through 7. To perform these various tasks, an analysis module 102 executes independently, or in coordination with, one or more processors 104, which is (or are) connected to one or more storage media 106. The processor(s) 104 is (or are) also connected to a network interface 108 to allow the computer system 101A to communicate over a data network 110 with one or more additional computer systems and/or computing systems, such as 101B, 101C, and/or 101D (note that computer systems 101B, 101C and/or 101D may or may not share the same architecture as computer system 101A, and may be located in different physical locations, e.g. computer systems 101A and 1101B may be on a ship underway on the ocean, in a well logging unit disposed proximate a wellbore drilling, while in communication with one or more computer systems such as 101C and/or 101D that are located in one or more data centers on shore, other ships, and/or located in varying countries on different continents).

A processor can include a microprocessor, microcontroller, processor module or subsystem, programmable integrated circuit, programmable gate array, or another control or computing device.

The storage media 106 can he implemented as one or more non-transitory computer-readable or machine-readable storage media. Note that while in the exemplary embodiment of FIG. 1 storage media 106 is depicted as within computer system 101A, in some embodiments, storage media 106 may be distributed within and/or across multiple internal and/or external enclosures of computing system 101A and/or additional computing systems. Storage media 106 may include one or more different forms of memory including semiconductor memory devices such as dynamic or static random access memories (DRAMs or SRAMs), erasable and programmable read-only memories (EPROMs), electrically erasable and programmable read-only memories (EEPROMs) and flash memories; magnetic disks such as fixed, floppy and removable disks; other magnetic media including tape; optical media such as compact disks (CDs) or digital video disks (DVDs); or other types of storage devices. Note that the instructions discussed above can be provided on one computer-readable or machine-readable storage medium, or alternatively, can be provided on multiple computer-readable or machine-readable storage media distributed in a large system having possibly plural nodes. Such computer-readable or machine-readable storage medium or media is (are) considered to be part of an article (or article of manufacture). An article or article of manufacture can refer to any manufactured single component or multiple components. The storage medium or media can be located either in the machine running the machine-readable instructions, or located at a remote site from which machine-readable instructions can be downloaded over a network for execution.

It should be appreciated that computing system 100 is only one example of a computing system, and that computing system 100 may have more or fewer components than shown, may combine additional components not depicted in the embodiment of FIG. 2, and/or computing system 100 may have a different configuration or arrangement of the components depicted in FIG. 2. The various components shown in FIG. 2 may be implemented in hardware, software, or a combination of both hardware and software, including one or more signal processing and/or application specific integrated circuits.

Further, the steps in the methods described above may be implemented by running one or more functional modules in information processing apparatus such as general purpose processors or application specific chips, such as ASICs, FPGAs, PLDs, or other appropriate devices. These modules, combinations of these modules, and/or their combination with general hardware are all included within the scope of protection of the invention.

In explaining example methods herein, an example of a spatial flux-scattering functions (FSF) technique for a neutron well logging instrument model is first reviewed. The starting point is to compute a set of FSFs for a particular neutron tool geometry and source configuration. See, e.g., FIG. 1. The instrument may be disposed in a subsurface formation (119 in FIG. 1) having a certain set of physical properties (e.g., fractional volume of pore space ("porosity"), pore fluid type, etc.

The FSFs may he generated from the Monte Carlo program known as "MCNP" and essentially correspond to the importance of each discrete (specified ahead of time in the modeling geometry) spatial element. The FSF then represents a three dimensional map of the importance that provides a way to obtain an average value of the formation property from the values specified in each spatial element of the formation. Initially, the neutron migration length, Lm, defined as the quadratic sum of the slowing-down length, Ls and the diffusion length Ld($L_m=\sqrt{L_s^2+L_d^2}$), was taken to represent the complete formation description. Thus, an intermediate output of the fast forward model may be the importance weighted average of all the Lm values from each volume element in the formation. The desired quantity of the fast forward neutron model, however, is the expected detector counting rate. For each detector, a separate set of Monte Carlo simulation program runs may be performed to define, for a given wellbore environment, the counting rate variation as a function of the formation Lm values in uniform formations. The foregoing procedure will work correctly as long as Lm, by itself, adequately correlates to the counting rate variations measured by the instrument in an experimental set up or as computed by the Monte Carlo simulation.

Figure 3:
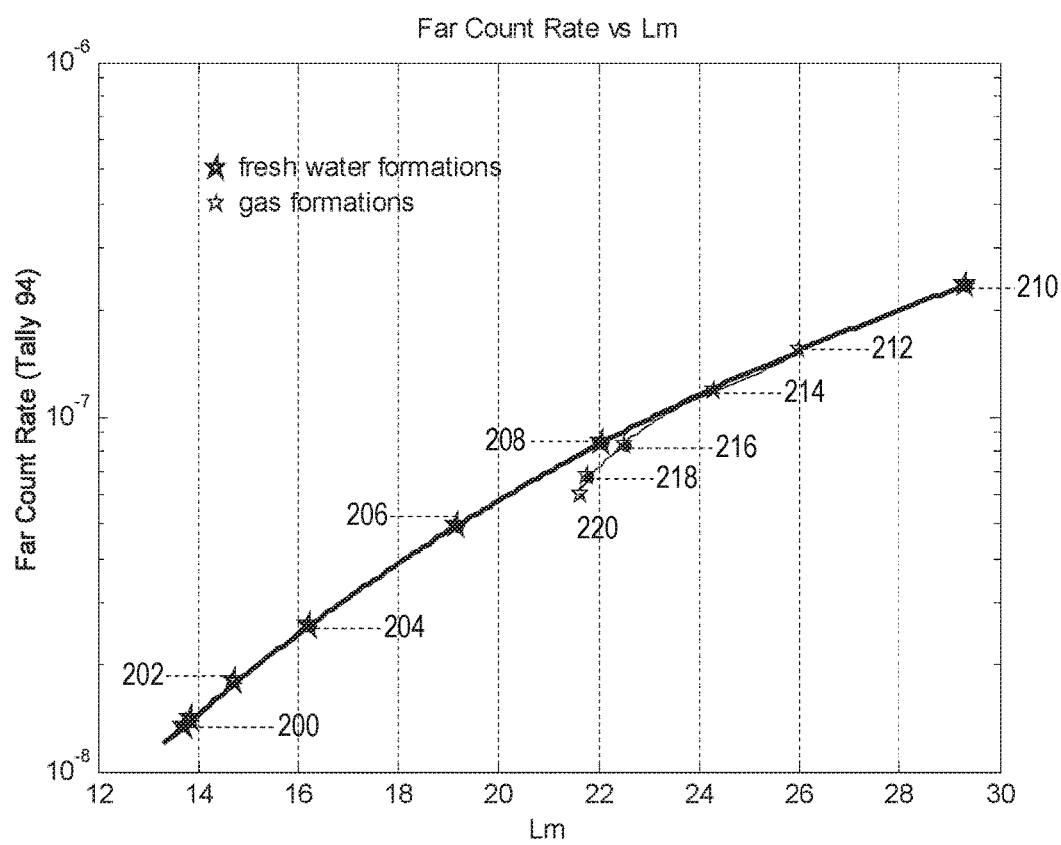
FIG. 3 illustrates an example of how an Lm value of fresh water-filled formations correlates with the logarithm of the detector counting rate, whereas gas-filled formations do not follow the same correlation.

FIG. 3 shows a graph of an example of how the Lm value of fresh water-filled. porous formations correlates with the logarithm of the far detector counting rate. The fresh water-filled formation porosity values are indicated by the symbols at 200 through 210 in FIG. 3, with a best fit curve joining the symbols. From the results displayed in FIG. 3, one can conclude that the detector counting rate can be readily predicted from the Lm value of the formation in fresh water filled porous formations.

A limitation to using Lm as the sole estimator of formation properties becomes immediately apparent when considering gas filled porous formations. In FIG. 3, the gas-filled porous formation detector counting rates do not fall on the fresh-water best fit curve. Simulated detector count rates for various gas filled porosity values are shown by symbols at 212-220 in FIG. 3. .As porosity values increase (Lm values decrease), the simulated detector counting rates can be observed to be considerably lower than the corresponding fresh water-filled detector counting rates. Thus, independent of the shape of the FSF surfaces, because they are normalized to unity, using FSF in conjunction with Lm may not adequately predict the detector counting rate in gas-filled formations because the averaged Lm values for gas-filled cases will be generally too large.

Figure 4:
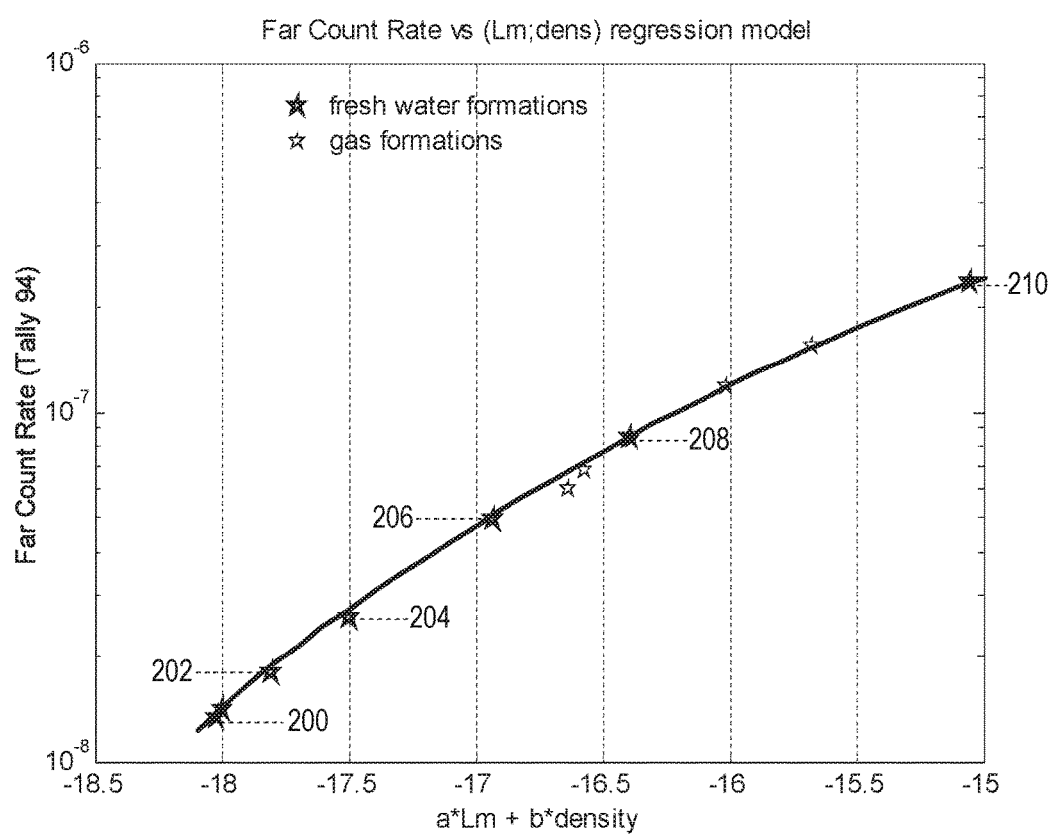
FIG. 4 illustrates combination of Lm and formation density to represent a description of the formation which has a single correlation to the logarithm of the counting rate.

The fresh water-filled and gas-filled data points shown in FIG. 3 can be harmonized by including a term that corresponds to the density of the porous formation. A simple linear combination of a function of Lm and formation density to represent a description of the formation, for use with the FSFs, can produce good agreement between simulated detector count rates for fresh water filled formations and gas filled formations as indicated in the graph of FIG. 4.

Figure 5:
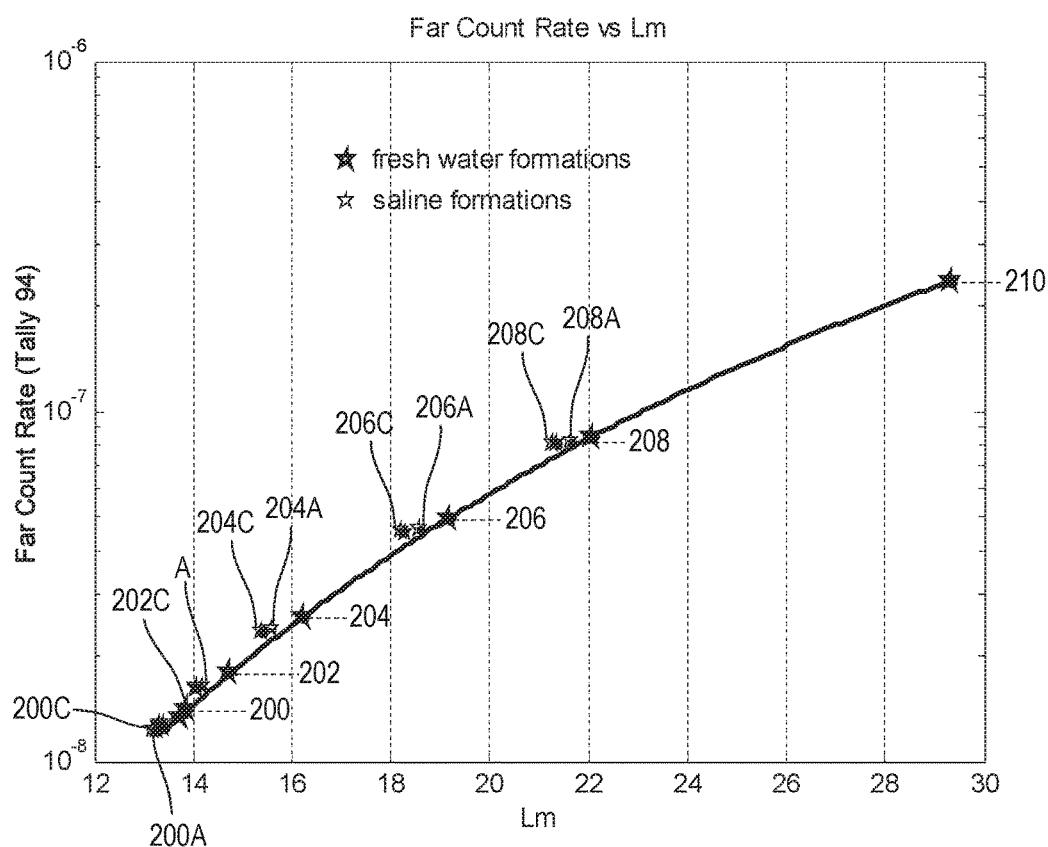
FIG. 5 illustrates cases, at formation porosity of 5-40 p.u., where the water salinity varies between 100, 200, 250 kppm salinity.

Salt-water filled porosity may be treated similarly. FIG. 5 shows a graph of Lm with respect to predicted detector counting rate for formation porosity values of 5-40 p.u., for fresh water and for water salinity values of 100, 200 and 250 kppm. Once again the fresh water-filled cases are indicated by the symbols at 200 through 210 and the simulated count rates with the various salinities are indicated by symbols indicated at 200C (250 kppm), 200A (100 kppm) through 208C and 208A. The simulations, for this particular detector configuration, show little counting rate variation while the Lm value varies with the change in the formation neutron capture cross section. Capture cross section variation can be accounted for by using the definition of another Lm value (Lm*) as was done in, Ellis, D. V. Flaum, C., Galford, J. E., and Scott, H. D., "*The Effect of Formation Absorption on the Thermal Neutron Porosity Measurement,*" Paper 16814-MS, 62$^{nd}$ SPE Annual Technical Conference and Exhibition, Dallas, Tex. (1987)).

Figure 6:
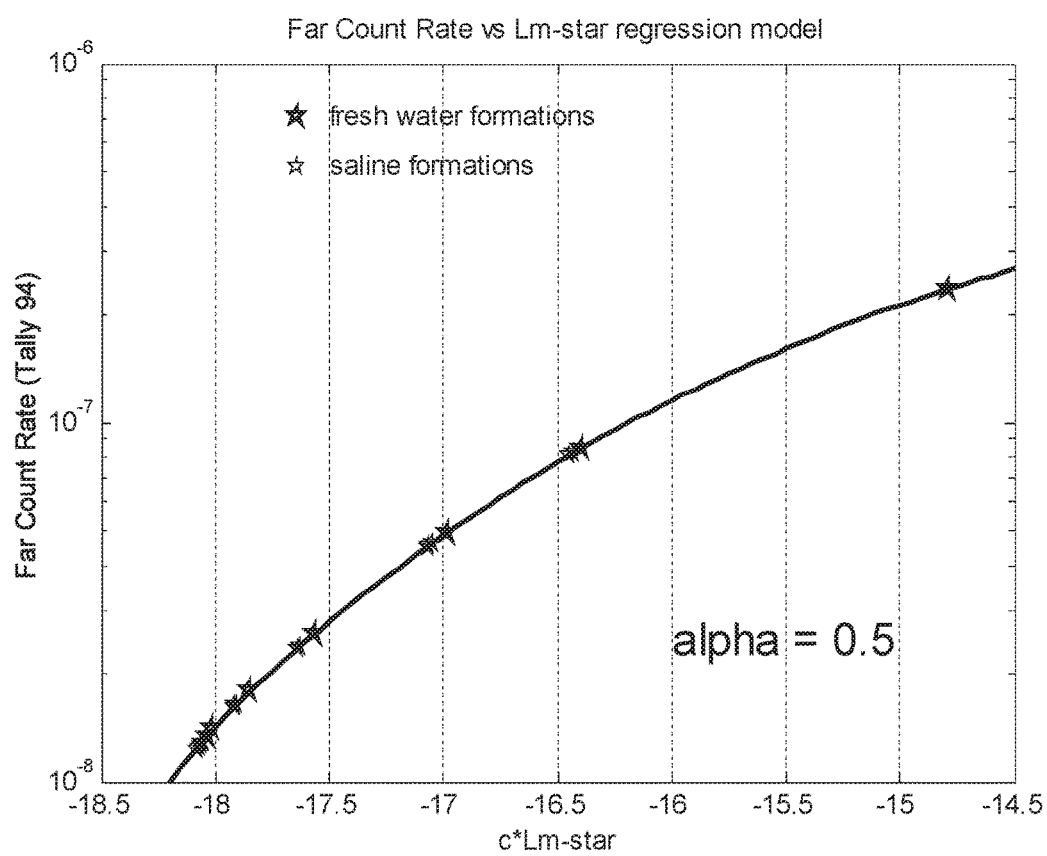
FIG. 6 shows how the data with salt-saturated formations can be reconciled with the fresh water data by substituting a new parameter, Lm*, for Lm.

FIG. 6 shows how simulated count rates using salt-saturated water in the formation pore spaces can be reconciled with the fresh water filled porosity simulated count rates by simply changing the mixing of the slowing down length Ls, and the diffusion length, Ld, in the definition of Lm*($L_m^*=\sqrt{L_s^2+\alpha L_d^2}$). For Lm, the weighting of the diffusion length, Ld, has an α factor of 1; best curve fits for simulated count rates that use Lm* have been shown to have an α of ~0.5 for the Ld contribution.

Figure 7:
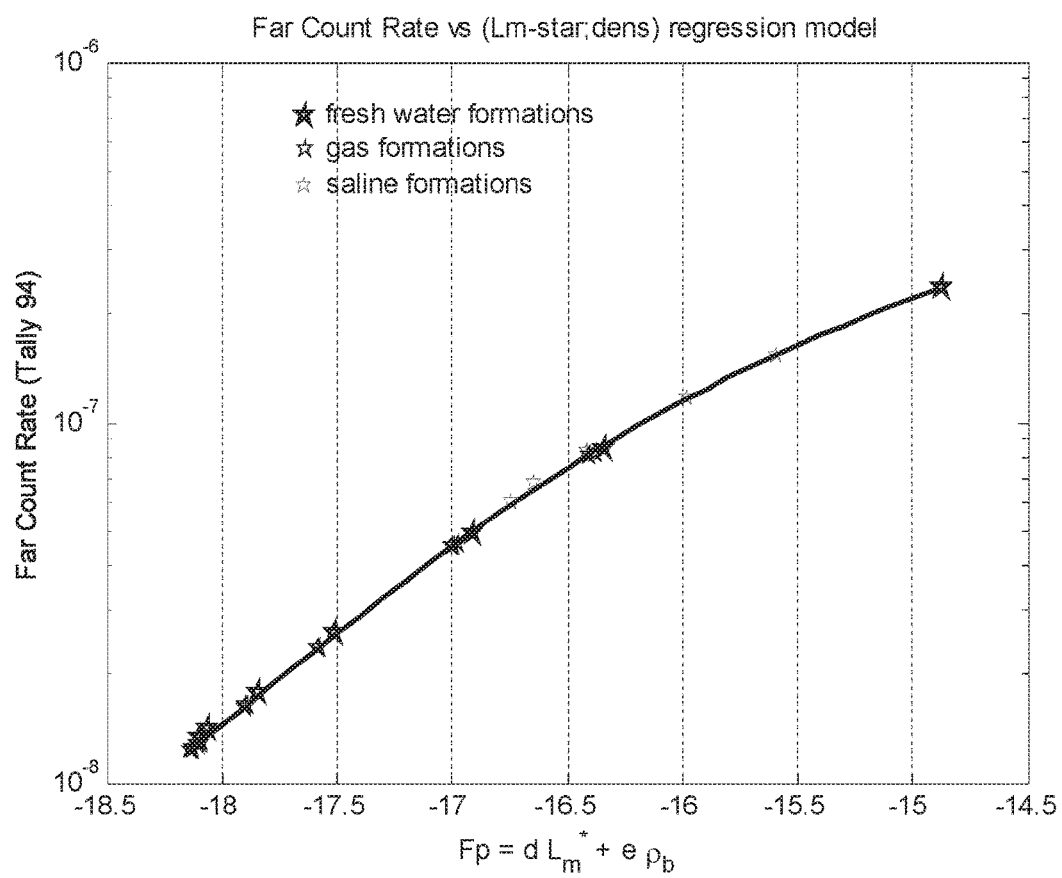
FIG. 7 shows the counting rate for water-filled, gas-filled and salt water-filled cases as a function of Lm* and density, which is called Fp, which has a single correlation to the counting rate for all formation properties.

One proposed solution is to make a transformed formation parameter that will correlate with the counting rate for all conditions. In one example, this may be performed by defining a new function, Fp, that weights an appropriate function of Lm* with the formation density, $\rho_b$. In FIG. 7, a graph of simulated counting rate for water-filled, gas-filled and salt-saturated water-filled formations at various values of porosity are shown as a function of Fp. Using the FSF procedure with the Fp values in the formation may thus result in more accurate counting rate predictions.

It should also be noted that although Fp is used as a parameter to characterize the formation in the present example, it should be understood that other Fp functional forms may be appropriate for detectors at different source-detector spacings and shielding arrangements.

Simulated neutron detector response may be used, in some examples as part of an inversion procedure to determine values of hydrogen index and/or other neutron related properties of the formation (119 in FIG. 1). Inversion may include making measurements of the formation using the instrument as shown in FIG. 1. An initial model of the formations may be generated, for example, including formation layers of various thicknesses, porosity values, formation water salinities and fractional volumes of water, gas and/or oil. A simulated response to the initial model may be generated using example techniques as explained above with reference to FIG. 7. The detector count rates simulated using the example technique may then be compared to the actual measurements made in the formation as shown in FIG. 1. Any one or more of the parameters of the initial model may be adjusted, and the simulation of detector response may be repeated. The foregoing may be repeated until differences between the simulated detector response and the measured response reach a minimum or fall below a selected threshold. The adjusted model at this point may be designated as a final model, that is, one which most closely represents the actual parameters of the subsurface formations.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should he limited only by the attached claims.

What is claimed is:

1. A method for simulating a response of a neutron well logging instrument, comprising:
   in a computer, calculating a weighted neutron migration length Lm* by using a neutron slowing down length Ls and weighting a neutron diffusion length Ld;
   in the computer, determining a function Fp based on a combination of the weighted neutron migration length Lm* and a formation density that is descriptive of a formation comprising a gas; and in the computer, calculating an expected radiation detector count rate using the function Fp, wherein the expected radiation detector count rate simulates the response of the neutron well logging instrument without performance of a Monte Carlo simulation.

2. The method of claim 1 wherein the radiation detector comprises a neutron detector.

3. The method of claim 1 comprising in the computer, calculating a sensitivity of the expected detector count rate to changes in formation property based on formation spatial flux scattering.

4. The method of claim 1, comprising repeating the calculating an expected radiation detector counting rate using the function Fp until a difference between the expected detector count rate is below a threshold.

5. The method of claim 1, wherein the neutron diffusion length Ld is weighted by a factor of approximately 0.5.

6. The method of claim 1, wherein the weighted neutron migration length Lm* is calculated according to the relationship below:

$L_m^* = \sqrt{L_s^2 + \alpha L_d^2}$, wherein $\alpha$ is a weight applied to the neutron diffusion length Ld.

7. The method of claim 1, comprising comparing the expected detector count rate with a measured count rate.

8. The method of claim 1, wherein the method is performed in real time.

9. A method for simulating a response of a neutron well logging instrument, comprising:
   in a computer, calculating a weighted neutron migration length Lm* by using a neutron slowing down length Ls and weighting a neutron diffusion length Ld;
   in the computer, determining a function Fp based on a combination of the weighted neutron migration length Lm* and a formation density that is descriptive of a formation comprising a gas; and
   in the computer, calculating an expected radiation detector count rate using the function Fp;
   using a neutron well logging instrument inserted in a wellbore penetrating subsurface formations and measuring count rate at least one detector on the instrument;
   comparing the expected radiation detector count rate with the measured count rate in the computer;
   adjusting at least one parameter of the function Fp in the computer; and
   repeating, in the computer, the calculating expected count rate and comparing to the measured count rate until differences between reach a minimum or fall below a selected threshold.

10. A non-transitory computer readable medium, the medium having stored thereon logic operable to cause a programmable computer to perform acts comprising:
   determining a neutron migration length Lm;
   calculating a weighted neutron migration length Lm* based on a slowing down length Ls and a weighted diffusion length Ld;
   determining a formation density that is descriptive of a formation comprising a gas;
   combining the weighted neutron migration length Lm* with the formation density to determine a function Fp; and calculating an expected radiation detector count rate using the function Fp, wherein the expected radiation detector count rate simulates the response of the neutron well logging instrument without performance of a Monte Carlo simulation.

11. The non-transitory computer readable medium of claim 10 wherein the radiation detector comprises a neutron detector.

12. The non-transitory computer readable medium of claim 10 comprising calculating a sensitivity of the expected detector count rate to changes in formation property based on formation spatial flux scattering.

13. The non-transitory computer readable medium of claim 10, wherein the medium having stored thereon logic operable to cause the programmable computer to perform acts further comprising comparing the expected detector count rate with a measured count rate.

14. The non-transitory computer readable medium of claim 10, wherein the medium having stored thereon logic operable to cause the programmable computer to perform acts further comprising repeating the calculating an expected radiation detector counting rate using the function Fp until a difference between the expected detector count rate is below a threshold.

15. The non-transitory computer readable medium of claim 10, wherein the diffusion length Ld is weighted by a factor of approximately 0.5.

16. The non-transitory computer readable medium of claim 10, wherein the weighted neutron migration length Lm* is calculated according to the relationship below:

$L_m^* = \sqrt{L_s^2 + \alpha L_d^2}$, wherein $\alpha$ is weight applied to the diffusion length Ld.

17. The non-transitory computer readable medium of claim 10, wherein the acts are performed in real time.

18. A method for well logging, comprising:
   inserting a neutron well logging instrument in a wellbore penetrating subsurface formations and measuring count rate at least one detector on the instrument;
   in a computer, determining a function Fp based on a combination of the weighted neutron migration length Lm* and a formation density that is descriptive of a formation comprising a gas; and
   in the computer, calculating an expected radiation detector counting rate using the function Fp;
   comparing the expected detector count rate with the measured count rate in the computer;
   adjusting at least one parameter of the function in the computer; and
   repeating, in the computer, the calculating expected count rate and comparing to the measured count rate until differences between reach a minimum or fall below a selected threshold.

19. The method of claim 18 wherein the radiation detector comprises a neutron detector.

20. The method of claim 18 comprising in the computer, calculating a sensitivity of the expected detector count rate to changes in formation property based on formation spatial flux scattering.

* * * * *